(12) United States Patent
Kirilenko et al.

(10) Patent No.: US 10,094,469 B2
(45) Date of Patent: Oct. 9, 2018

(54) APPARATUS FOR OPTOELECTRONICALLY DETECTING A SELECTOR LEVER POSITION, SELECTOR LEVER APPARATUS, METHOD FOR PRODUCING AN APPARATUS AND METHOD FOR OPTOELECTRONICALLY DETECTING A SELECTOR LEVER POSITION WHEREIN PREDETERMINED LIGHT INTENSITIES OR FILTERED WAVELENGTHS ARE ASSIGNED TO PREDETERMINED POSITIONS

(71) Applicant: ZF Friedrichshafen AG, Friedrichshafen (DE)

(72) Inventors: Alexander Kirilenko, Diepholz (DE); Karsten Straßburg, Hannover (DE); Ludger Rake, Steinfeld (DE)

(73) Assignee: ZF Friedrichshafen AG, Friedrichshafen (DE)

( * ) Notice: Subject to any disclaimer, the term of this patent is extended or adjusted under 35 U.S.C. 154(b) by 105 days.

(21) Appl. No.: 15/321,571

(22) PCT Filed: May 19, 2015

(86) PCT No.: PCT/EP2015/060939
§ 371 (c)(1),
(2) Date: Dec. 22, 2016

(87) PCT Pub. No.: WO2015/197263
PCT Pub. Date: Dec. 30, 2015

(65) Prior Publication Data
US 2017/0152938 A1    Jun. 1, 2017

(30) Foreign Application Priority Data

Jun. 24, 2014 (DE) .......... 10 2014 212 054

(51) Int. Cl.
*F16H 59/10* (2006.01)
*H03K 17/94* (2006.01)
(Continued)

(52) U.S. Cl.
CPC ............ *F16H 59/105* (2013.01); *G01D 5/26* (2013.01); *G01D 5/34* (2013.01); *H03K 17/941* (2013.01)

(58) Field of Classification Search
CPC ... F16H 59/105; F16H 59/044; H03K 17/941; H03K 17/968; G01D 5/26; G01D 5/34
(Continued)

(56) References Cited

U.S. PATENT DOCUMENTS 6,710,322 B1 * 3/2004 Baltes ................. F16H 59/105
250/214 PR
6,989,526 B2  1/2006 Bohne et al.
9,389,102 B2  7/2016 Hartrampf et al.

FOREIGN PATENT DOCUMENTS

DE    40 38 998 C1    5/1992
DE    298 17 668 U1   2/1999
(Continued)

OTHER PUBLICATIONS

Office Action of Priority Application DE102014212054.3 dated Mar. 5, 2015, 10 pages, German Language, with English Translation on pp. 9-10.
(Continued)

*Primary Examiner* — Que T Le
(74) *Attorney, Agent, or Firm* — Brinks Gilson & Lione

(57) ABSTRACT

The present disclosure relates to a device for the optoelectronic detection of different positions of a selection lever for selecting different gear steps of a gearshift transmission, in particular a motor vehicle transmission. The detection device can be coupled to the selection lever, and comprises
(Continued)

at least one light source for emitting light, and one light sensor for detecting the emitted light. The detection device is distinguished in that the light sensor is provided for detecting a light intensity, or a wavelength of the emitted light, respectively, filtered by means of a light filter that can be disposed in a light path between the at least one light source and the light sensor, and to transmit data regarding the detected light intensity, or wavelength, respectively, to an evaluation device. Predetermined light intensities, or predetermined filtered wavelengths, respectively, are assigned thereby to predetermined selection lever positions, which are selected form different positions of the selection lever.

20 Claims, 7 Drawing Sheets

(51) Int. Cl.
*G01D 5/34* (2006.01)
*G01D 5/26* (2006.01)

(58) Field of Classification Search
USPC .......................................... 250/221, 239, 216
See application file for complete search history.

(56) References Cited

FOREIGN PATENT DOCUMENTS

DE    10 2005 045 865 A1    3/2007
DE    10 2010 022 337 A1    12/2011

OTHER PUBLICATIONS

International Search Report dated Aug. 7, 2015 in International Application No. PCT/EP2015/060939, 4 pages, German Language.
Written Opinion of the International Search Authority dated Jun. 24, 2014 in International Application No. PCT/EP2015/060939, 6 pages, German Language.
English Language Translation of International Search Report dated Aug. 7, 2015 in International Application No. PCT/EP2015/060939, 3 pages.

* cited by examiner

APPARATUS FOR OPTOELECTRONICALLY DETECTING A SELECTOR LEVER POSITION, SELECTOR LEVER APPARATUS, METHOD FOR PRODUCING AN APPARATUS AND METHOD FOR OPTOELECTRONICALLY DETECTING A SELECTOR LEVER POSITION WHEREIN PREDETERMINED LIGHT INTENSITIES OR FILTERED WAVELENGTHS ARE ASSIGNED TO PREDETERMINED POSITIONS

This application is a filing under 35 U.S.C. § 371 of International Patent Application PCT/EP2015/060939, filed May 19, 2015, and claims the priority of DE 10 2014 212 054.3, filed Jun. 24, 2014. These applications are incorporated by reference herein in their entirety.

The present disclosure relates to a device for the optoelectronic detection of different positions of a selection lever for selecting different gear steps of a gearshift transmission, in particular a motor vehicle transmission. Furthermore, the device relates to a selection lever device for a gearshift transmission, in particular for a motor vehicle transmission, a method for producing a device for the optoelectronic detection of different positions of a selection lever, and a method for the optoelectronic detection of different positions of a selection lever.

A device for the optoelectronic detection of selection lever positions can be used, for example, in a vehicle, in order to detect a gear step of a motor vehicle transmission selected by a driver, and to transmit this to a control device for shifting the motor vehicle transmission in accordance with the selected gear step. An optoelectronic detection device is based thereby on a contactless detection of the selection lever position by means of using a light-emitting light source, a device that influences the emitted light or the light source, and a light sensor for detecting a portion of the emitted light, wherein the detected light portion can be assigned to a selection lever position.

EP 0 844 418 discloses an optoelectronic detection device, which has an encoder disk that can be attached to a selection lever, having light passages in a predetermined arrangement, which is disposed in a light path between light source and the light sensor, such that it can be moved with the selection lever. In each of the selection lever positions that is to be detected, a predetermined light pattern is transmitted toward the light sensor by means of the encoder disk, wherein each predetermined light pattern is assigned to a predetermined detectable selection lever position. A similar detection principle is disclosed, for example, in DE 199 60 466, JP 207-118699 and EP 2 687 760.

Based on this, the present disclosure creates an improved device for the optoelectronic detection of a selection lever position, a selection lever device, a method for producing a device for the optoelectronic detection of a selection lever position, and a method for the optoelectronic detection of a selection lever position. In particular, an alternative optoelectronic detection device is provided with the proposed devices and methods, which furthermore can be designed to be more compact and less expensive. Advantageous designs can be derived from the dependent Claims and the following description.

The present disclosure makes use, in particular, of a light property of the light emitted from a light source. A light property refers to the factors that characterize a light, such as the light wavelengths, the light intensity, or irradiance, and a light emission frequency, or flash frequency of the light, wherein the present disclosure makes use, in particular, of the light intensity or irradiance, and the light wavelengths for detecting a selection lever position.

The device proposed with the present disclosure can be coupled to a selection lever, and comprises at least one light source for emitting light, and one light sensor for detecting the emitted light. The light source can be a light emitting diode (LED) for example, or a conventional incandescent light bulb. The light sensor can be a photo-semiconductor, for example, or more preferably a photodiode or a phototransistor. The proposed device is distinguished in that the light sensor is provided for detecting a light intensity, or a wavelength of the emitted light, filtered by a light filter that can be disposed between the at least one light source and the light sensor, and to transmit data regarding the detected light intensity or wavelength to an evaluation device. Predetermined light intensities, or predetermined filtered wavelengths are assigned thereby to predetermined selection lever positions, selected from the different positions of the selection lever. The light sensor is preferably an optical detector, or optoelectronic sensor, which converts light into an electric signal, using a photoelectric effect, and issues an electric resistance that is a function of the incident light radiation. The light sensor is configured to the at least one light source, or, respectively, the light emitted from the at least one light source. The light sensor can thus be a light intensity sensor or, in accordance with an alternative solution, a light wavelength sensor. It is further preferred that the at least one light source is configured to emit light in the visible range, while the light sensor is provided for detecting the light emitted by the at least one light source in a visible range.

By this means, at least one alternative solution for an optoelectronic detection device can be provided. Furthermore, the proposed solution enables a greater degree of freedom with regard to a design that meets the requirements for an optoelectronic detection device.

According to a preferred embodiment, the detection device comprises a light well, which delimits a light space, in which the at least one light source is disposed. The light well can, for example, have walls that encompass the at least one light source. More preferably, the light well can extend from a carrier element that supports, or retains, respectively, the at least one light source. It is furthermore preferred that the light well abuts the carrier element. As a result, light scattering losses between the light well and the carrier material can be substantially minimized. In addition, the light well can preferably be connected to the carrier element. As a result, a stable arrangement of the light well on the carrier material can be enabled. The connection between the light well and the carrier material can be implemented by means of typical means of attachment, such as adhesive, clamp, snap-on, or screw connections, or suchlike. According to a preferred embodiment, it is conceivable that the light well and the carrier material are formed by a single part.

The space delimited by the light well forms the light space, which is lit by the at least one light source when it is in an active state. In other words, the light emitted by the at least one light source in the light space is captured at least in a lateral direction starting from the at least one light source. The light well can preferably have reflective surfaces on the sides delimiting the light space, in order to reduce an absorption loss of the emitted light in the light well. The light well acts, together with a light entry, which can be attached to the selection lever, such that it is adjacent to the at least one light source, or can move in relation to the at least one light source, wherein the light sensor is coupled to the light entry, such that the light sensor detects or senses at least a portion of an incident light portion of the emitted light in the light entry. The light well can preferably comprise an aperture for this, along which the light entry can move by means of moving the selection lever. Alternatively thereto, the light well can comprise an aperture, in which a retaining element that retains the light entry engages, in order to movably guide the light entry inside the light space. The retaining element can furthermore preferably be a free end of the selection lever thereby. Thus, the light entry can be attached directly to the selection lever. The aperture is preferably formed opposite the at least one light source. By way of example, the aperture can be formed in a light well cover lying opposite the at least one light source, covering at least the light space.

It is furthermore preferred that at least one light source is disposed exclusively on a location assigned to an end position of the selection lever that can be assumed. As a result, it can be ensured that at the location assigned to the end position of the selection lever, the light intensity of the light emitted by the at least one light source has the highest value. In other words, starting from the end position of the selection lever, and the assigned location in the light well, no light source is disposed or provided at the other locations, to each of which a position of the selection lever that differs from the end position is assigned. With an increasing distance of a possible position of the selection lever to the end position of the selection lever, the light intensity of the light emitted by the at least one light source thus decreases. By assigning corresponding light intensity ranges to one of the positions that the selection lever can assume, the possible positions of the selection lever can be reliably detected by the light sensor in an advantageous manner. In order to increase the light intensity, preferably more than one light source can be disposed at the location assigned to the end position. As a result, a more reliable detection of a respective prevailing light intensity at a location of the possible selection lever position can be obtained. The end position can be a gear step D for forward driving, or R for reverse driving, or P for parking, for example, wherein the last of these end positions is used in selection lever devices in which the parking setting can be selected by means of the selection lever. If the parking setting can be actuated by means of a button, for example, it is preferred that the at least one light source is assigned to the end position D or R.

According to another preferred embodiment, the light sensor can be attached to the selection lever, wherein the light entry is incorporated in the light sensor. As a result, the detection device can be combined with a selection lever device, such that a compact design of the selection lever and detection device can be obtained. Moreover, a simply constructed detection device for detecting the selection lever position can be provided in this manner.

In accordance with an alternative preferred embodiment, a waveguide can be attached to the selection lever, wherein the waveguide comprises a light exit, which is disposed opposite a sensor surface of the light sensor, wherein the light exit is connected to the light entry via a waveguide element, by means of which the light portion of the emitted light entering the light entry is conducted to the light exit. The waveguide element can be a light guiding solid body, or a light reflecting hollow body, in which the light portion of the emitted light entering the light entry is reflected, or mirrored toward the light exit. The waveguide element is moreover, preferably designed such that it is flexible, in order to appropriately follow a movement of the selection lever. The flexible waveguide element can be made, for example, from a liquid silicon rubber (LSR). Alternatively, the waveguide element can have a waveguide coupling element in the region of a bearing for the selection lever, via which the light portion of the emitted light entering the light entry is conducted via a waveguide element section connected to the light exit. It is furthermore preferred that the waveguide element can be disposed inside the selection lever in a region for the waveguide element ranging from at least one free end of the selection lever lying opposite the at least one light source to a selection lever exit. The selection lever exit can lie thereby in the region of the bearing for the selection lever. This preferred embodiment is particularly preferred in conjunction with the waveguide coupling element. As a result, waveguides that are to be disposed on the outside of the selection lever can be avoided, which are more susceptible to external effects that waveguides running in the selection lever.

According to a preferred embodiment, a light source is disposed in the light well for each position that can be assumed by the selection lever for selecting a gear step, wherein adjacent light sources are each shielded from one another by means of a light shielding element disposed between them. Respective adjacent light sources are designed thereby to emit light with different light intensities. It is furthermore preferred that all of the light sources are designed to emit light with a light intensity that differs from that of the other light sources. As a result, an assignment of the possible selection lever positions that can be assumed to the respective light intensity ranges can occur in a simple and reliable manner. Different light intensities of the respective light sources can be obtained, for example, by means of incorporating a series resistor upstream of the respective light source. Thus, the same types of light sources can be used for the respective light sources, wherein a corresponding series resistor is electrically connected upstream of the respective light source on the carrier. As a result, it is possible to obtain an arrangement of light sources having light emissions of different light intensities. Alternatively thereto, different light source types having different light intensities from the start could be selected, and provided for the proposed device.

In accordance with another preferred alternative embodiment, the light well has a passage leading to the light sensor, wherein a light reflecting element can be attached to the selection lever, forming the light entry and a light exit, wherein a light portion of the light entering the light entry is reflected toward the passage via the light exit. The light reflecting element can be a mirror element, having a light reflecting surface, which can be pivoted with the selection lever. The reflecting surface forms both the light entry as well as the light exit thereby. In accordance with the law of light reflection, the light striking the reflecting surface is emitted, or reflected at the same angle. Depending on the angle the passage leading to the light sensor is subjected to different light intensities, such that, according to a selection lever setting, or selection lever position, respectively, different light intensities can be detected by the light sensor. In this manner, light intensity ranges can be assigned to each selection lever position, by means of which a position of the selection lever can be detected by the light sensor. By this means, an economical and simply constructed detection device for detecting different positions of a selection lever can be created.

In accordance with another preferred alternative embodiment, a light filter can be attached to the selection lever in a light path between the light source and the light sensor, wherein the light filter has a number of different color filter elements equivalent to the number of different selection lever positions that are to be detected, for a predefined filtering of the light portion of the emitted light entering the light entry, wherein each filter element forms the light entry with a surface facing the light source. The light source can be a light emitting diode (LED) that emits white light thereby, which acts together with the respective color filter elements such that the respective color filter element filters the color assigned to the respective color filter element out of the white light of the white light LED. Alternatively to the white light LED, other light source types that emit white light can certainly be used. Because in this manner, it is not necessary to have numerous light sources that emit colored light, it is possible to create a more economical detection device. The color filter elements disposed upstream of the light sensor in the respective positions of the selection lever enable, by this means, a similar sensing to when light sources emitting colored light are used. Furthermore, by means of the color filter elements, the number of necessary light sources can be significantly reduced.

According to another preferred embodiment, the light sensor and the at least one light source are disposed on a common carrier element. The carrier element is preferably a conventional printed circuit board, by means of which electronic components can be supplied with electrical energy, and can be connected thereto in a conductive manner. As a result, a compact design of the device can be obtained.

In accordance with another aspect of the present disclosure, a selection lever device for a gearshift transmission, in particular for a motor vehicle transmission, is proposed, wherein the selection lever device comprises a selection lever that can be moved between different positions, for selecting different gear steps of the gearshift transmission. The proposed selection lever device is distinguished in that the selection lever comprises an interface for coupling with a device such as that described above. The interface is preferably provided for allocating a light sensor, a waveguide, or a light filter to the selection lever, and connecting or attaching it thereto. The device can be disposed thereby for optoelectronic detection, preferably integrated in the selection lever device. As a result, a compact unit comprising the selection lever device and detection device can be created. Alternatively, according to a preferred embodiment, the detection device can be disposed next to the selection lever device, and more preferably, it can be coupled to the selection lever device. Thus, alternatively, a detection device can be provided on an existing selection lever device, wherein the connection between the detection device and the selection lever device can be implemented by means of corresponding, typical connecting means, or connecting mechanisms, e.g. a clamping, snap-on, or screw connecting mechanism. In this manner, the detection device can also be attached or connected to the selection lever device in a modular manner. It is further preferred that the detection device can be releasably coupled to the selection lever device. As a result, the detection device can be replaced in a simple manner if it becomes defective.

According to another aspect of the present disclosure, a method for producing a device for the optoelectronic detection of different positions of a selection lever for selecting different gear steps of a gearshift transmission is proposed. The method comprises a step for providing at least one light source and one light sensor. The light sensor is provided for detecting a light intensity or a wavelength of the emitted light filtered by means of a light filter that can be disposed in a light path between the at least one light source and the light sensor, and to transmit data regarding the detected light intensity or wavelength, respectively, to an evaluation device. Predetermined light intensities or predetermined filtered wavelengths, respectively, are assigned thereby to predetermined selection lever positions, which are selected from the different positions of the selection lever. The method furthermore comprises a step for arranging the at least one light source and the light sensor, such that at least a light portion of the light emitted from the at least one light source can be detected by the light sensor. By means of this proposed method, a device such as that described above can be provided in an advantageous manner.

In accordance with another aspect of the present disclosure according to the method, a method is proposed for the optoelectronic detection of different positions of a selection lever for selecting different gear steps of a gearshift transmission. The method comprises a step for moving the selection lever into a different position than an initial position, and a step for detecting a light portion of a light emitted from at least one light source by means of a light sensor. The light sensor is provided for detecting a light intensity or a wavelength of the emitted light filtered by means of a light filter that can be disposed in a light path between the at least one light source and the light sensor, and to transmit data regarding the detected light intensity or wavelength, respectively, to an evaluation device. Predetermined light intensities, or predetermined filtered wavelengths are assigned thereby to predetermined selection lever positions, selected from the different positions of the selection lever. The proposed method can be executed, for example, by means of a device such as that described above. A simple and quick detection of a selection lever position can be obtained by means of the method.

Preferably, a step for activating the light source can be inserted in front of the step for detecting a light portion. The activation step can be combined thereby, for example, with the step for moving the selection lever, or it can be inserted in front of this step, or after this step. As a result, it can be ensured that the at least one light source is only provided with sufficient electrical power for emitting light when the selection lever is moved. In this manner, energy consumption can be reduced.

Further features and advantages of the disclosure can be derived from the following description of preferred exemplary embodiments of the disclosure, based on the figures and drawings, which show details essential to the disclosure, and from the claims. The individual features can be realized in and of themselves, or in plurality, in arbitrary combinations in a preferred embodiment.

Preferred exemplary embodiments shall be explained in greater detail based on the attached drawings. Therein:

In the following description of preferred exemplary embodiments, the same or similar reference symbols shall be used in the various figures for the elements depicted therein having similar functions, wherein there shall be no repetition of the descriptions thereof.

Figure 1:
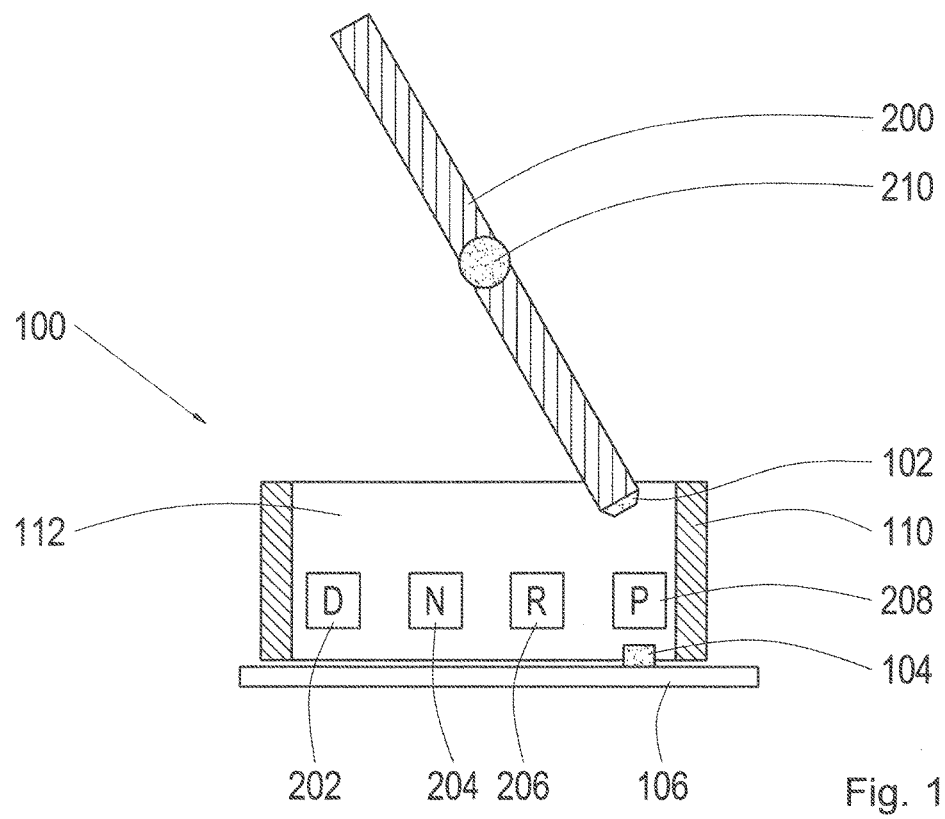
FIG. 1 shows a schematic depiction of a device for the optoelectronic detection of different positions of a selection lever according to a preferred exemplary embodiment.

FIG. 1 shows a schematic depiction of a device 100 for the optoelectronic detection of different positions of a selection lever 200 for selecting different gear steps 202, 204, 206, 208 of a gearshift transmission. In detail, the gear step 202 is assigned to a forward driving mode D for "drive," the gear step 204 is assigned to a neutral setting N, the gear step 206 is assigned to a reverse driving mode R, and the gear step 208 is assigned to a parking setting P. The selection lever 200 is pivotably supported by means of a cardanic bearing 210 in a selection lever housing, not shown, of a selection lever device. The selection lever 200 is shown in FIG. 1 in one of two end positions of the selection lever pivoting movement, wherein the gear step 208 for the parking setting P is selected. The selection lever 200 has a light sensor 102 on one of its longitudinal ends, wherein the light sensor 102 is disposed on the free longitudinal end of the selection lever 200, which lies opposite the free longitudinal end of the selection lever 200, via which a user can apply an actuation force to the selection lever 200 for actuating the selection lever 200. The longitudinal end of the selection lever 200 supporting the light sensor 102 extends into a light space 112 of a light well 110 of the detection device 100. The light well 110 is formed by a hollow body, the interior space of which defines the light space 112. The light well 110 is disposed on one side of a carrier element 106, said side of which likewise supports a light source 104. The light source 104 is disposed inside the light space 112. The light source 104 is a light emitting diode (LED) that emits a white light in this preferred exemplary embodiment. The carrier element 106 is a printed circuit board in this preferred exemplary embodiment, having conductor paths for establishing an electroconductive connection for electronic or electrical components. The light source 104 is coupled to an energy source via the printed circuit board 106 such that it can conduct electricity, which energy source supplies the light source 104 with sufficient power for emitting light when it is in its active state. The light source 104 can be coupled to a control device for this, which can activate the light source 104 as needed for detecting the selection lever position. The control device can be the selection lever device, or the gearshift transmission, or an independent control device, thereby.

The light well 110 thus has wall extending from the carrier element 106 toward the selection lever 200, which defines the light space 112. The light well 110 can be made, for example, of a material containing plastic. The inner walls of the light well 110 can preferably have a reflecting surface coating. The reflecting surface coating can be formed as an integral part of the light well 110, or can be applied later in another method step. By means of the light well 100, the light emitted by the light source 104 is received in the predefined light space 112 and deflected toward the selection lever 200.

The light source 104 is disposed in this preferred exemplary embodiment at a location assigned to the gear step 208 for the parking setting P on the carrier element. The main emission direction of the light source 104 is oriented parallel to a continuous central axis of the light space 112 passing vertically through the carrier element 106. As a result, a majority of the light emitted by the light source 104 is emitted along the main emission direction, whereby a light intensity having the highest value prevails at the location where the light source 104 is disposed. This can be further promoted by the interior reflecting surface coating of the light well 110.

Figure 2:
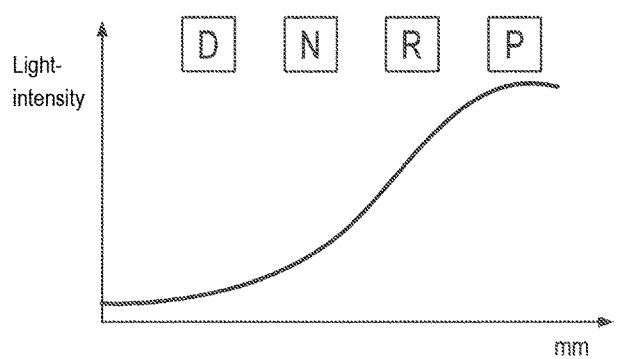
FIG. 2 shows a graphic depiction of a light intensity distribution of a device shown in FIG. 1.

FIG. 2 shows a graphic depiction of a light intensity distribution, or irradiance distribution of the light source 104 for the detection device 100 shown in FIG. 1. With this graphic depiction, the light intensity is shown in relation to the spacing in millimeters between individual selection lever positions, each assigned to a predetermined gear step 202, 204, 206, 208 of the motor vehicle transmission. Thus, the detection device 100 exhibits a highest light intensity value at the gear step 208 for the parking position P. The light intensity decreases continuously in the light space 112 along the pivotal movement direction of the selection lever 200 from the one end position, which is assigned to the gear step 208 for the parking position P, to the other end position, which is assigned to the gear step 202 for the forward driving mode D, via the gear steps 204, 206 lying therebetween, for the neutral setting N and reverse driving mode R.

Thus, the light intensity of the light emitted by the light source 104 in the light space 112 is lower at a first intermediate position, e.g. for the gear step 206 for the reverse driving mode R, than the light intensity in a first end position for the gear step 208 for the park setting P. Accordingly, the light intensity in a second intermediate position, e.g. for the gear step 204 for the neutral setting N, is lower than the light intensity in the first intermediate position. Furthermore, the light intensity in a second end position, which is assigned to the gear step 202 for the forward driving mode D, is lower than the light intensity in the second intermediate position. Based on light intensity distribution, a position of the selection lever 220 can be distinctly detected via an assignment of the respective gear steps to the respective light intensity values or value ranges, as a function of the setting of the selection lever 200.

Figure 3:
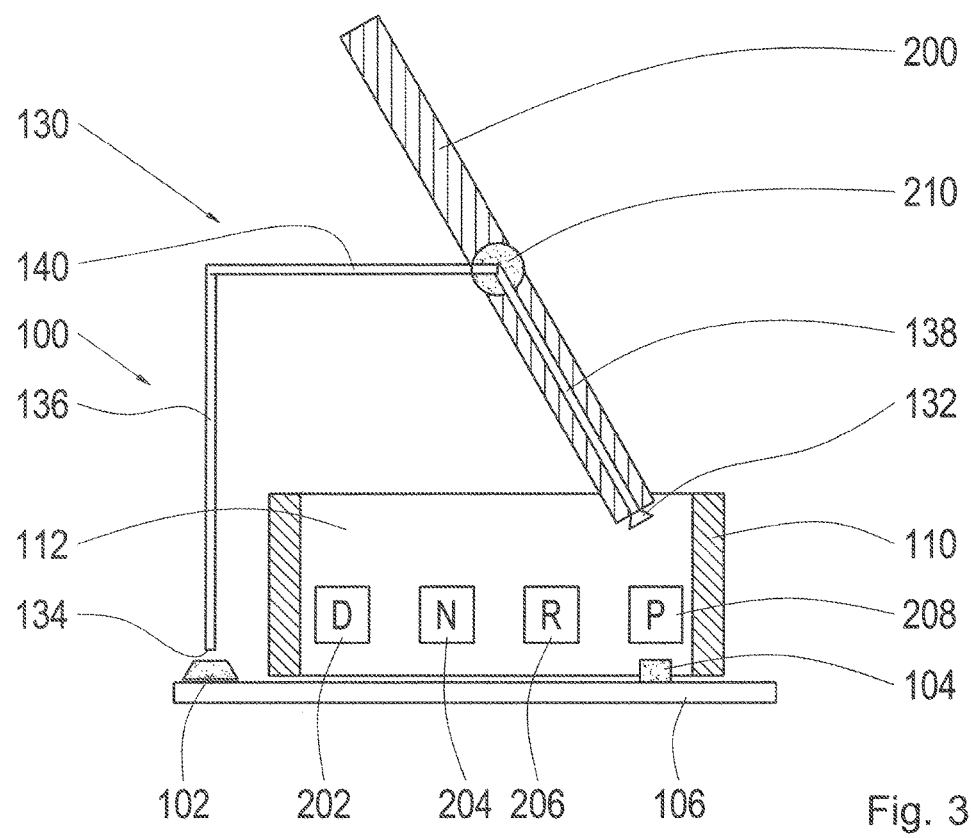
FIG. 3 shows a schematic depiction of a detection device according to another preferred exemplary embodiment.

FIG. 3 shows a schematic depiction of a device 100 for the optoelectronic detection of different positions of a selection lever 200 according to another preferred exemplary embodiment. The device 100 according to this preferred exemplary embodiment differs from the exemplary embodiment shown in FIG. 1 by the use of a waveguide 130. In detail, the light sensor 102 is disposed outside the light well 110 on the carrier element 106. Alternatively, the light sensor 102 can be disposed in the light well 110, wherein the light well 110 has a light shielding element that shields the light sensor 102 from the light space 112, in order to prevent the light sensor 102 from being exposed directly to the light emitted by the light source 104.

The waveguide 130 has a light entry 132, which is disposed on the longitudinal end of the selection lever 200 that extends into the light space 112. The waveguide 130 further comprises a light exit 134, which is disposed opposite a sensor surface of the light sensor 102. The light entry 132 is connected to the light exit 134 via a waveguide element 136, such that a light portion of the light emitted by the light source 104 entering the light entry 132 is conducted to the light exit 134. The waveguide element 136 runs inside the selection lever 200 in this preferred exemplary embodiment from the light entry 132 via the cardanic bearing 210 toward the light exit 134. The waveguide 130 can preferably be flexible. Furthermore, the waveguide 130 can have a light conducting coupling point in the region of the cardanic bearing 210, in order to connect, in a light conducting manner, a waveguide element section 138 that can be moved together with the selection lever 200 to another waveguide element section 140 extending out of the cardanic bearing 210.

Figure 4:
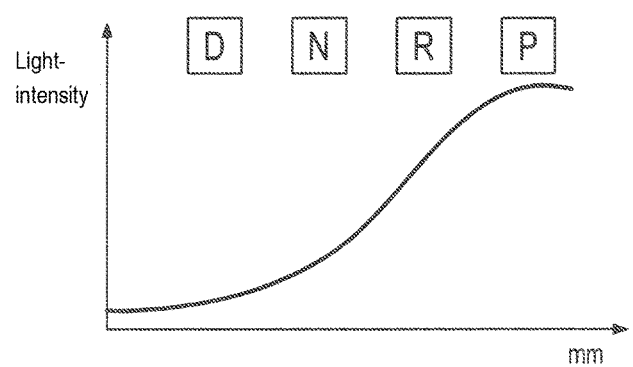
FIG. 4 shows a graphic depiction of a light intensity distribution of a device shown in FIG. 3.

FIG. 4 shows, in the same manner as FIG. 2, a light intensity distribution of the detection device 100 shown in FIG. 3. The use of a waveguide allows the light sensor to be disposed on a carrier element that supports the light source and which forms electric connections. As a result, otherwise necessary electrical lines for electrically connecting the light sensor are no longer necessary. As a result, it is possible to create a more economical detection device for the optoelectronic detection.

Figure 5:
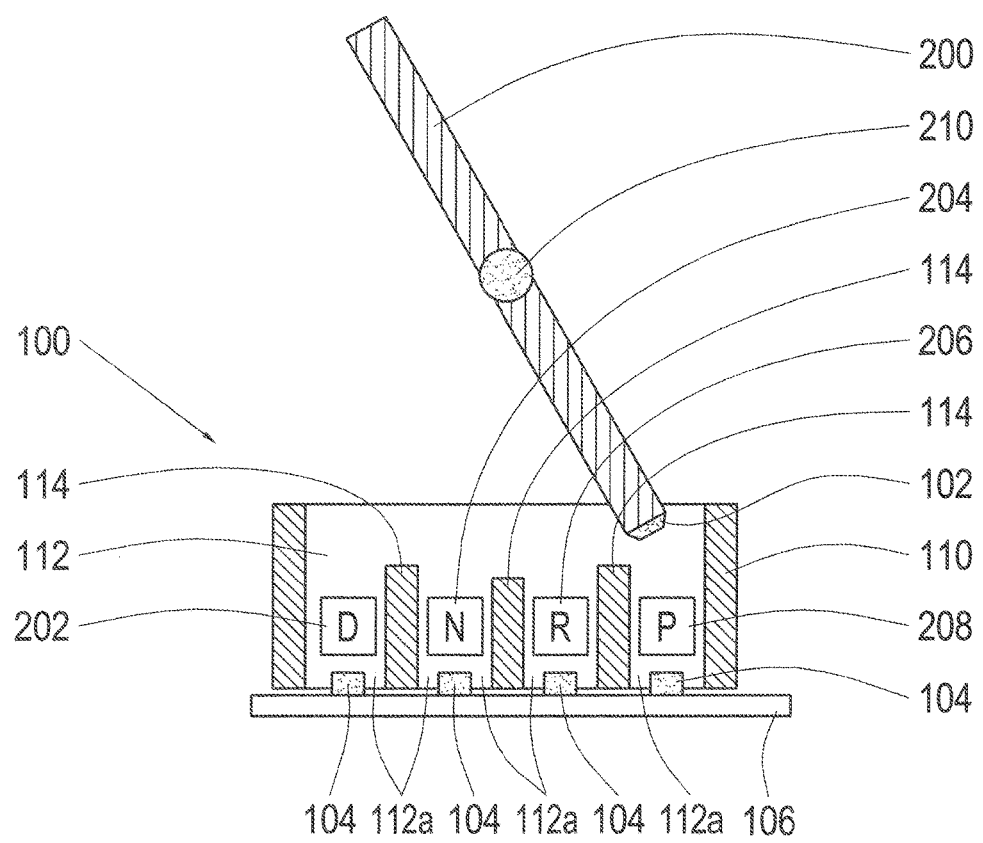
FIG. 5 shows a schematic depiction of a detection device according to another preferred exemplary embodiment.

FIG. 5 shows a schematic depiction of a device 100 for the optoelectronic detection of different positions of a selection lever 200 according to another preferred exemplary embodiment. This preferred exemplary embodiment differs from the preferred exemplary embodiment shown in FIG. 1 substantially in that for each selection lever position, which is assigned to a predetermined gear step 202, 204, 206, 208, there is at least one light source 104. In detail, the detection device 100 in this preferred exemplary embodiment comprises a light well 110, in which at least four light sources 104 are disposed on a carrier element 106. Each of the adjacent light sources 104 are separated from one another in a light shielding manner via a shielding element 114. As a result, further sub-light spaces 112a are formed in the light space 112 created by the light well 110, in which one light source 104 is disposed in each case. The respective sub-light spaces 112a are assigned thereby to the predetermined gear steps 202, 204, 206, 208, or the corresponding selection lever positions, respectively. The light sources 204 are provided for emitting light with different light intensities. Thus, at least each of the selection lever positions assigned to a gear step 202, 204, 206, 208, can be assigned a predetermined light intensity value or value range, respectively, for detecting the selection lever position. The different light intensities can be obtained, for example, by means of series resistors, which are incorporated upstream in the electrical line for the respective light source 104. Alternatively, light sources 104 have different emission characteristics with regard to light intensity can be used. The device 100 according to this preferred exemplary embodiment enables a precise assignment of light intensity values or value ranges, respectively, to the respective selection lever positions, or the gear steps assigned to the respective selection lever positions.

Figure 6:
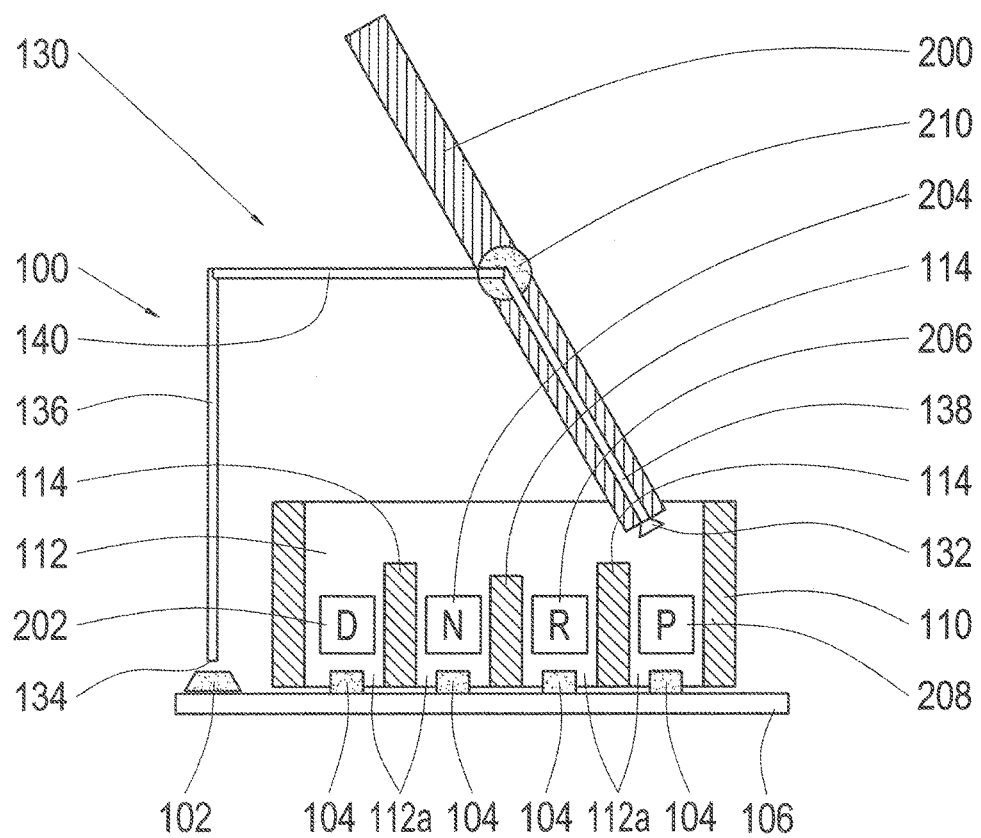
FIG. 6 shows a schematic depiction of a detection device according to another preferred exemplary embodiment.

FIG. 6 shows a schematic depiction of a device 100 for the optoelectronic detection of different positions of a selection lever 200 according to another preferred exemplary embodiment. This preferred exemplary embodiment differs from the exemplary embodiment shown in FIG. 5 in the arrangement of a waveguide 130 in the light path between the light source 104 and the light sensor 102. The waveguide 130 has the same design as the waveguide of the preferred exemplary embodiment shown in FIG. 3, to which reference is made here.

Figure 7:
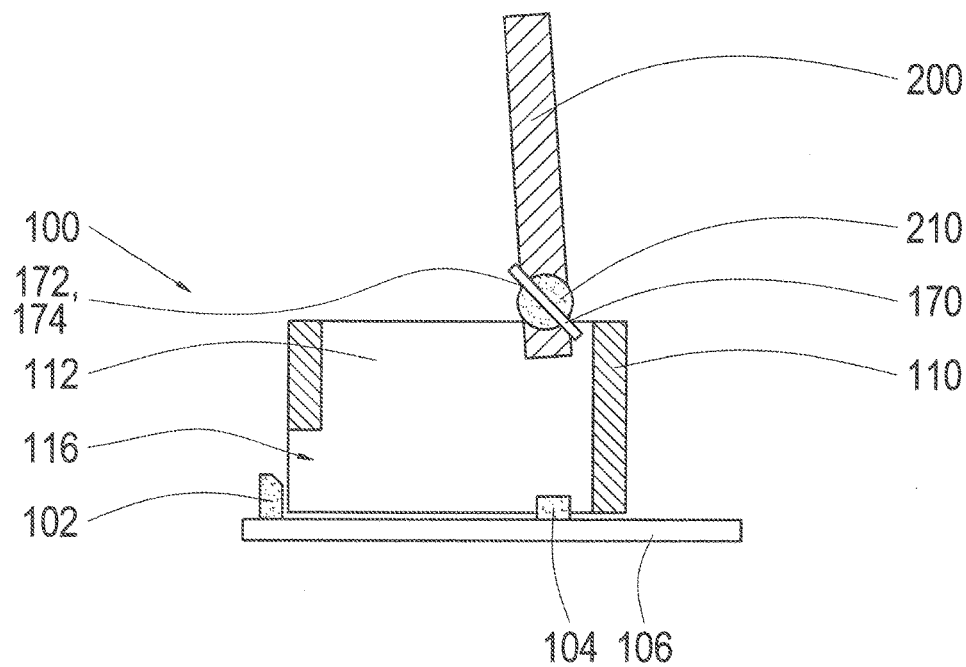
FIG. 7 shows a schematic depiction of a detection device according to another preferred exemplary embodiment.

FIG. 7 shows a schematic depiction of a device for the optoelectronic detection of different positions of a selection lever 200 according to another preferred exemplary embodiment. This preferred exemplary embodiment differs from the preferred exemplary embodiment shown in FIG. 2 substantially in that, instead of a waveguide, a light reflecting element 170 can be moved together with the selection lever 200 in the region of the cardanic bearing 210, in particular, it is pivotably disposed therein. The light reflecting element 170 is formed by a mirror element in this preferred exemplary embodiment. The surface of the mirror element 170 facing the light source 104 forms the light entry 172 as well as the light exit 174. The light entering the light entry 172 is reflected, or mirrored, in complying with the law of reflection, to a passage 116 via the light exit 174, which is formed in the light well 110. The passage 116 conducts the light reflected by the light reflecting element 170 to a light sensor 102 disposed outside the light space 112. The light sensor 102 is disposed on the carrier element 106.

The mirror element 170 is shown with a planar light entry 172 and light exit 174 in this preferred exemplary embodiment. Alternatively, the light entry 172, or the light exit 174, respectively, can be curved, or exhibit a transverse wave, in order to obtain a light diffusion appropriate to the intended use.

The mirror element 170 can be pivoted together with the selection lever 200. The selection lever 200 is shown in an end position assigned to the parking position P. When the selection lever 200 is actuated, the mirror element 170 pivots therewith, by means of which a tilting of the light entry surface 172 in relation to the light source 104 and the light exit surface 174 in relation to the light sensor 102 changes. As a result, the light sensor 102 is exposed to a light having a different intensity in different selection lever positions.

Figure 8:
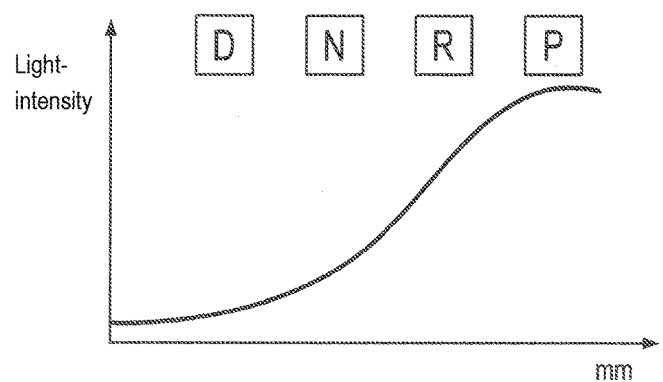
FIG. 8 shows a graphic depiction of a light intensity distribution of a device shown in FIG. 7.

FIG. 8 shows a light intensity distribution of the device shown in FIG. 7, in the same manner as is shown in FIGS. 2 and 4. Accordingly, the light intensity in the respective selection lever positions is different. Thus, by means of this economical and simply constructed detection device, a reliable detection of the selection lever position is likewise possible.

Figure 9:
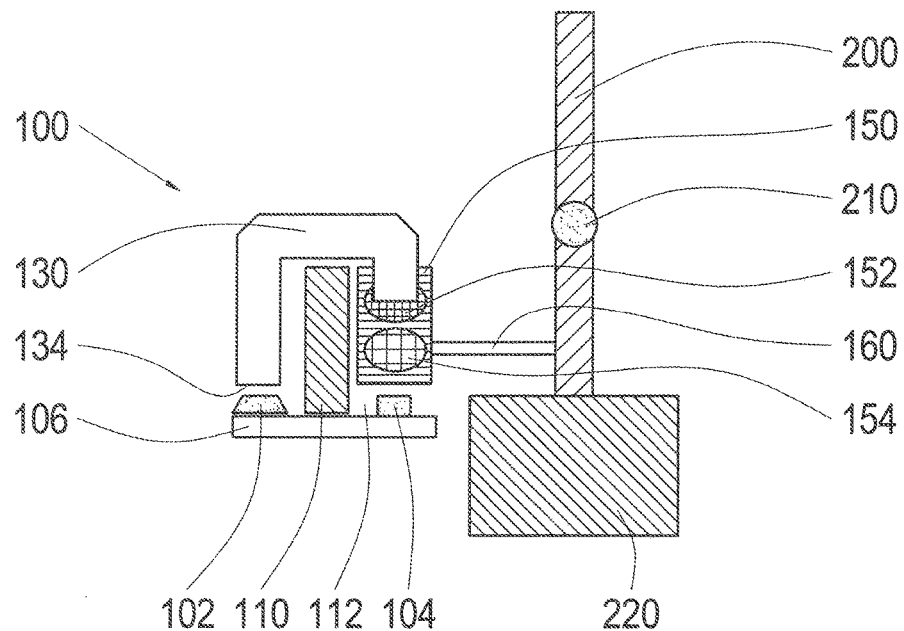
FIG. 9 shows a schematic depiction of a detection device according to another preferred exemplary embodiment.
Figure 10:
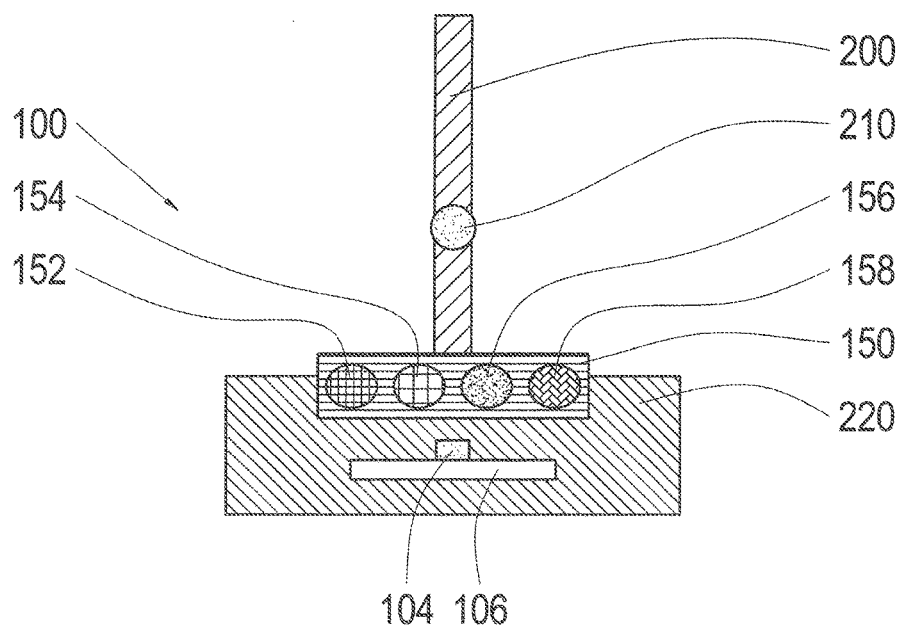
FIG. 10 shows another schematic depiction of the detection device shown in FIG. 9.

FIGS. 9 and 10 each show a schematic depiction of a device 100 for the optoelectronic detection of different positions of a selection lever 200 according to another preferred exemplary embodiment. The device 100 according to this preferred exemplary embodiment differs from those described above in that a selection lever position, or a gear step assigned to a selection lever position, respectively, can be detected by means of a light sensor 102, which is designed to detect a light wavelength, and to transmit a signal corresponding to the detected wavelength to an evaluation device. For this, the device 100 has a color filter 150, which is connected to the selection lever 200. The color filter 150 comprises a number of different color filter elements 152, 154, 156, 158, corresponding to the number of gear steps. The respective color filter elements 152, 154, 156, 158 are provided for filtering out a predetermined color of a light emitted by a light source 104 in a translucent manner. By way of example, the color filter element 152 can be a green filter. The adjacent color filter element 154 can, by way of example, be a yellow filter. The color filter element 156 adjacent thereto can be a blue filter, for example. The color filter element 158 adjacent thereto can be a red filter, for example. The respective color filter elements 152, 154, 156, 158 are disposed in a line, wherein the assembly is coupled to the selection lever 200, such that in each selection lever position, which is assigned to a predetermined gear step of the motor vehicle transmission, a predetermined color filter element selected from the color filter elements 152, 154, 156, 158 ends up lying opposite a light source 104. This is shown, in an exemplary manner, in the schematic depiction in FIG. 9. In this depiction, the color filter element 154 that allows the color yellow to pass through it is disposed lying opposite the light source 104. The selection lever position of the selection lever 200 assumed for this is assigned to the gear step 204 for the neutral setting N. As a result, the light emitted by a light source 104 is filtered by the filter element 154 that allows the color yellow to pass through it, such that a wavelength corresponding to the color yellow is emitted from the color filter element 154. The light emitted with this wavelength is conducted by means of a waveguide 130 to a light sensor 102 in this preferred exemplary embodiment. The light sensor 102 and the light source 104 are disposed on a common carrier element 106, which is a printed circuit board, and connected electrically. The light sensor 102 is disposed thereby outside a light well 110, wherein the light well 110 has a light space 112, in which the light source 104, as well as the color filter 150, are disposed. The color filter 150 is coupled via an attachment element 160 to the selection lever 200, wherein the attachment element 160 is inserted into an aperture, not shown, in a light well wall, not shown, such that it can move freely with the selection lever 200.

The device 100 can be disposed inside or outside a selection lever housing, not shown, of a selection lever device, in this preferred exemplary embodiment. If the device 100 is disposed outside the selection lever housing, the device 100 has a housing encompassing the components, to protect them from external effects.

The selection lever 200 shown in FIGS. 9 and 10 is likewise at least pivotably supported by means of a cardanic bearing 210, wherein a longitudinal end of the selection lever 100 lying opposite an end facing a user is coupled to a snap-in device 200. A selection of a gear step can be indicated haptically to a user by means of the snap-in device 200.

The device 100 shown with this preferred exemplary embodiment allows for an optoelectronic detection of a selection lever position based on a wavelength that is to be detected, in contrast to the preferred exemplary embodiments described above, which detect a selection lever position based on the different light intensities assigned to the selection lever positions. Furthermore, an optoelectronic detection device having a lower number of light sources can be created with the device 100 according to this preferred exemplary embodiment, wherein, furthermore, a reliable detection of the respective selection lever positions, or the gear steps assigned to different selection lever positions, respectively, is possible.

Figure 11:
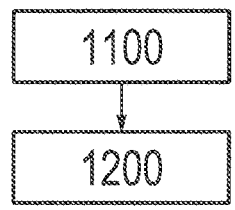
FIG. 11 shows a flow chart for a method for producing a device for the optoelectronic detection of different positions of a selection lever according to a preferred exemplary embodiment.

FIG. 11 shows a flow chart for a method for producing a device for the optoelectronic detection of different positions of a selection lever for selecting different gear steps of a gearshift transmission, in particular a motor vehicle transmission. By way of example, a device can be produced using the method according to this preferred exemplary embodiment, such as that described based on the preceding figures.

In a step 1100, at least one light source and one light sensor are provided. The light sensor is provided thereby, for detecting a light intensity or a wavelength filtered by means of a light filter that can be disposed in a light path between the at least one light source and the light sensor, and transmitting data regarding the detected light intensity, or wavelength, respectively, to an evaluation device. Predetermined light intensities, or predetermined filtered wavelengths are assigned thereby to predetermined selection lever positions, selected from the different positions of the selection lever.

In a subsequent step, the at least one light source and the light sensor are disposed such that at least a light portion of the light emitted by the at least one light source can be detected by means of the light sensor.

Figure 12:
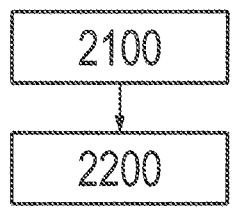
FIG. 12 shows a flow chart for a method for the optoelectronic detection of different positions of a selection lever according to a preferred exemplary embodiment.

FIG. 12 shows a schematic flow chart for a method for the optoelectronic detection of different positions of a selection lever for selecting different gear steps of a gearshift transmission, in particular a motor vehicle transmission, according to a preferred exemplary embodiment. By way of example, an optoelectronic detection can be executed using a device, such as that described based on the preceding figures, using the method according to this preferred exemplary embodiment.

In a step 2100, moving the selection lever into a position differing from the initial position. The initial position can be a selection lever position assigned to one of the corresponding gear steps described above, while the selection lever position differing thereto is a selection lever position that is assigned to a gear step differing from that of the initial position.

In a further step 2200, a light portion of a light emitted by a light source is detected by means of a light sensor. The light sensor is provided thereby to detect a light intensity or a wavelength of the emitted light, filtered by means of a light filter that can be disposed in a light path between the at least one light source and the light sensor, and to transmit data regarding the detected light intensity, or the wavelength, respectively, to an evaluation device, wherein predetermined light intensities, or predetermined filtered wavelengths, respectively, are assigned to predetermined selection lever positions, which are selected from the different positions of the selection lever.

The exemplary embodiments described herein, and shown in the figures, are selected only by way of example. Different exemplary embodiments can be combined with one another, either in their entirety, or with respect to individual features. An exemplary embodiment can also be supplemented by features of another exemplary embodiment.

Furthermore, method steps may be repeated, as well as executed in a sequence other than that described, as long as this is reasonably possible.

REFERENCE SYMBOLS

100 Device
102 Light sensor
104 Light source
106 Carrier element
110 Light well
112 Light space
112a Sub-light space
114 Light shielding element
116 Passage
130 Waveguide
132, 172 Light entry
134, 174 Light exit
136 Waveguide element
138 First waveguide element section
140 Second waveguide element section
150 Color filter
152, 154, 156, 158 Color filter element
160 Attachment element
170 Light reflecting element
200 Selection lever 202, 204, 206, 208 Gear steps
210 Cardanic bearing
1100 Step for providing
1200 Step for arranging
2100 Step for moving
2200 Step for detecting

The invention claimed is:

1. A detection device for the optoelectronic detection of different positions of a selection lever for selecting different gear steps of a gearshift transmission, wherein the detection device is configured to be coupled to the selection lever, the detection device comprising:
at least one light source for emitting light, and
a light sensor for detecting the emitted light, wherein the light sensor is configured to detect a light intensity or a wavelength of the emitted light,
wherein the light sensor is configured to transmit data regarding the detected light intensity or wavelength to an evaluation device, wherein predetermined light intensities or predetermined filtered wavelengths are assigned to predetermined positions of the selection lever.

2. The detection device according to claim 1, wherein the detection device further comprises a light well which delimits a light space in which the at least one light source is disposed, wherein a light entry is attached to the selection lever adjacent to the light space such that the light entry can move in relation to the at least one light source, wherein the light sensor is coupled to the light entry such that the light sensor senses at least a portion of the emitted light entering the light entry.

3. The detection device according to claim 1, wherein the light sensor is configured to be attached to the selection lever, wherein the light entry is located in the light sensor.

4. The detection device according to claim 1, wherein a waveguide is configured to be attached to the selection lever, wherein the waveguide comprises a light exit disposed opposite a sensor surface of the light sensor, wherein the light exit is coupled to the light entry via a waveguide element through which the portion of the emitted light entering the light entry is conducted to the light exit.

5. The detection device according claim 2, wherein the selection lever can assume a plurality of positions for selecting a gear step, wherein a light source is disposed in the light well for each of the plurality of positions that can be assumed by the selection lever, wherein each adjacent light source is shielded from the neighboring light source by a light shielding element disposed therebetween, and wherein each adjacent light source is designed to emit light having different intensities.

6. The detection device according to claim 2, wherein the light well has a passage leading to the light sensor, and a light reflecting element is configured to be attached to the selection lever, wherein the light reflecting element forms the light entry and a light exit, wherein the portion of the emitted light entering the light entry is reflected toward the passage via the light exit.

7. The detection device according to claim 2, wherein a light filter is configured to be attached to the selection lever in a light path between the light source and the light sensor, wherein the light filter has a plurality of different color filter elements for a predetermined filtering of the portion of the emitted light entering the light entry, wherein the number of different color filter elements corresponds to the number of different selection lever positions, wherein each color filter element forms the light entry with a surface facing the light source.

8. The detection device according claim 1, wherein the light sensor and the at least one light source are disposed on a common carrier element.

9. A selection lever device for a gearshift transmission in a motor vehicle transmission, comprising:
a selection lever configured to move between different positions for selecting different gear steps of the gearshift transmission, wherein the selection lever has a coupling point for coupling to a detection device according to claim 1.

10. A method for producing a device for the optoelectronic detection of different positions of a selection lever for selecting different gear steps of a gearshift transmission, comprising:
providing at least one light source for emitting light and a light sensor, wherein the light sensor is configured to detect a light intensity or a wavelength of the emitted light that is filtered by a light filter disposed in a light path between the at least one light source and the light sensor, wherein the light sensor is configured to transmit data regarding the detected light intensity or wavelength to an evaluation device, wherein predetermined light intensities or predetermined filtered wavelengths are assigned to predetermined positions of the selection lever positions, and
arranging the at least one light source and the light sensor such that at least a portion of the light emitted by the at least one light source can be detected by the light sensor.

11. A method for the optoelectronic detection of different positions of a selection lever for selecting different gear steps of a gearshift transmission, comprising:
moving the selection lever into a position differing from the initial position of the selection lever, and
detecting a portion of a light emitted by at least one light source, wherein a light sensor is provided for detecting a light intensity, or a wavelength of the emitted light filtered by a light filter that can be disposed in a light path between the at least one light source and the light sensor, wherein the light sensor is configured to transmit data regarding the detected light intensity or wavelength to an evaluation unit, wherein predetermined light intensities or predetermined filtered wavelengths are assigned to predetermined positions of the selection lever.

12. The detection device according to claim 1, further comprising a light filter disposed in a light path between the at least one light source and the light sensor, wherein the light filter is configured to filter the emitted light.

13. The detection device according to claim 2, wherein the light well has at least one reflective surface on a portion of the light well facing the light space.

14. The detection device according to claim 5, wherein each light source emits light having a different intensity than the other light sources.

15. The detection device according to claim 5, wherein the light sources obtain different intensities through a series resistor located upstream of the light sources.

16. The detection device according to claim 5, wherein at least one of the light sources is a different type of light source than the other light sources, and wherein the light source of a different type produces different intensity light than the other light sources.

17. The detection device according to claim 2, wherein a primary emission direction of the at least one light source is oriented parallel a central axis of the light space.

18. The detection device according to claim 1, wherein the detection device detects different positions of the selection lever of a gearshift transmission in a power-driven vehicle transmission.

19. The detection device according to claim 2, wherein the light sensor is disposed outside the light well.

20. The selection lever device according to claim 9, wherein the selection lever has a bearing, the detection device further comprising a waveguide configured to be attached to the selection lever, wherein the waveguide comprises a light entry and comprises a light exit disposed opposite a sensor surface of the light sensor, wherein the light exit is coupled to the light entry via a waveguide element through which the portion of the emitted light entering the light entry is conducted to the light exit, wherein the waveguide has a conducting coupling point adjacent to the bearing.

* * * * *

UNITED STATES PATENT AND TRADEMARK OFFICE
CERTIFICATE OF CORRECTION

PATENT NO. : 10,094,469 B2  
APPLICATION NO. : 15/321571  
DATED : October 9, 2018  
INVENTOR(S) : Kirilenko et al.

Page 1 of 1

It is certified that error appears in the above-identified patent and that said Letters Patent is hereby corrected as shown below:

In the Claims

In Column 13, Claim 5, Line 42, insert -- to -- between "according" and "claim"

In Column 14, Claim 8, Line 1, insert -- to -- between "according" and "claim"

Signed and Sealed this  
Eleventh Day of December, 2018

Andrei Iancu  
*Director of the United States Patent and Trademark Office*